United States Patent [19]

Thro

[11] Patent Number: 4,619,002
[45] Date of Patent: Oct. 21, 1986

[54] SELF-CALIBRATING SIGNAL STRENGTH DETECTOR

[75] Inventor: Stuart W. Thro, Cary, Ill.

[73] Assignee: Motorola, Inc., Schaumburg, Ill.

[21] Appl. No.: 627,270

[22] Filed: Jul. 2, 1984

[51] Int. Cl.⁴ .................. H04B 17/00; H04B 1/16
[52] U.S. Cl. .................................. 455/226; 455/52; 455/234; 455/254; 375/76; 375/98
[58] Field of Search ............ 455/50, 52, 54, 56, 455/254, 226, 242, 246, 200, 239, 219, 234; 375/76, 98 B; 307/362, 358; 324/130

[56] References Cited

U.S. PATENT DOCUMENTS

| | | | |
|---|---|---|---|
| 3,588,716 | 6/1971 | Turner | 328/167 |
| 3,728,633 | 4/1973 | Krebs | 455/138 |
| 3,755,741 | 8/1973 | Stover | 455/226 |
| 4,200,840 | 4/1980 | Tsui | 455/266 |
| 4,272,719 | 6/1981 | Niki et al. | 324/72 |
| 4,365,192 | 12/1982 | Rankin et al. | 324/72 |

Primary Examiner—Marc E. Bookbinder
Assistant Examiner—Andrew J. Telesz, Jr.
Attorney, Agent, or Firm—James E. Jacobson, Jr.; Edward M. Roney; Donald B. Southard

[57] ABSTRACT

A self-calibrating signal strength detector is described. The present invention utilizes a relatively narrow dynamic range receiver sensitivity threshold indicator circuit to calibrate the output signal of a relatively wide dynamic range signal strength detector. In accordance with the present invention, a processing device monitors the outputs of the signal strength detector and receiver sensitivity threshold indicator circuit simultaneously, and determines a correction factor to be applied to the output of the signal strength detector when the receiver sensitivity threshold indicator circuit indicates that a received signal is at the receiver sensitivity threshold.

10 Claims, 12 Drawing Figures

SELF-CALIBRATING SIGNAL STRENGTH DETECTOR

RELATED PATENT APPLICATION

The present application is related to the instant assignee's U.S. Pat. No. 4,481,670, filed Nov. 12, 1982, entitled "Method and Apparatus For Dynamically Selecting Transmitters For Communications Between a Primary Station and Remote Stations of a Data Communications System" and invented by Thomas A. Freeburg and U.S. patent application Ser. No. 603,399 filed Apr. 24, 1984 entitled "Improved Data Communications System Transmitter Selection Method and Apparatus" and invented by Stuart W. Thro, which applications are herein incorporated by reference.

BACKGROUND OF THE INVENTION

1. Field of the Invention

This invention relates generally to the field of radio communications systems and more particularly to an improved method and apparatus for measuring the signal strength of a received signal wherein the output signal of the signal strength measuring apparatus is adaptively altered to compensate for the effects of component aging and variations which occur during manufacturing.

2. Description of the Prior Art

In radio communication systems covering larger geographical areas than can be covered with a single radio frequency transmitter, a selection scheme must be used to insure that the transmitter selected will provide good quality communications to the desired remote station.

The problem of selecting which of several possible radio transmitters should be used to respond to a remote station has been solved with a limited degree of success in several different ways. According to one technique, a radio receiving the strongest RF signal from a selected remote station is used to define the approximate location of that remote station. The primary station simply selects the radio transmitter covering the geographical area of the receiver receiving the strongest signals from the selected remote station.

According to another technique, the remote station determines the zone in which it is operating by the transmitter having the largest signal strength. This technique requires that each transmitter in the system operate on an independent frequency, and that communications from the primary station to a selected remote station be sent in all zones in order for the remote station to make its choice known on demand.

Either of the above mentioned techniques requires some method by which signal strength may be accurately measured. Conventional receivers generally derive an analog voltage directly proportional to the received signal by coupling amplification circuitry to the output of the receiver detector circuit. The signal strength indicator signal is then compared to a fixed reference or threshold voltage to generate a squelch signal which is used to turn the receiver audio on or off. A squelch of this type is described in U.S. Pat. No. 4,359,780, to Day, and is assigned to the assignee of the present invention.

Each of the above signal strength techniques and circuitry is subject to variations which occur due to manufacturing tolerances as well as variations which occur in the materials which are used to fabricate the circuitry. Moreover, in a system having a plurality of radios, the receiver sensitivity threshold level may vary at a different rate over temperature, for each respective radio, due to variations in the components used to fabricate the signal strength circuitry.

OBJECTS AND SUMMARY OF THE INVENTION

Accordingly, it is an object of the present invention to provide a signal strength indicating circuit which adaptively alters the signal strength threshold level of the receiver circuitry to compensate for the effects of component aging and variation.

It is yet another object of the present invention to provide a signal strength indicating circuit which eliminates radio-to-radio receiver sensitivity threshold variations.

It is still another object of the present invention to provide an improved method and apparatus for adaptively altering the output of the signal strength detector based upon a comparison of several signals in determining whether a received signal is relatively acceptable.

Briefly described, the present invention contemplates an adaptive signal level detector in which a receiver senstivity threshold indicator is used to adaptively compensate for variations in RF signal level as well as variations in the radio components. The present invention comprises three elements. A RF signal level circuit with a logarithmic response and a relatively wide dynamic range, A receiver sensitivity threshold indicator of narrow dynamic range which can be used to identify received signals which are at or near the sensitivity threshold of the receiver system, and a data processing device which accumulates measured samples of signal strength and determines which RF signal strength samples are at the receiver sensitivity threshold, and using that information to calibrate the threshold point of the wide range detector.

DETAILED DESCRIPTION OF THE DRAWINGS

Figure 1:
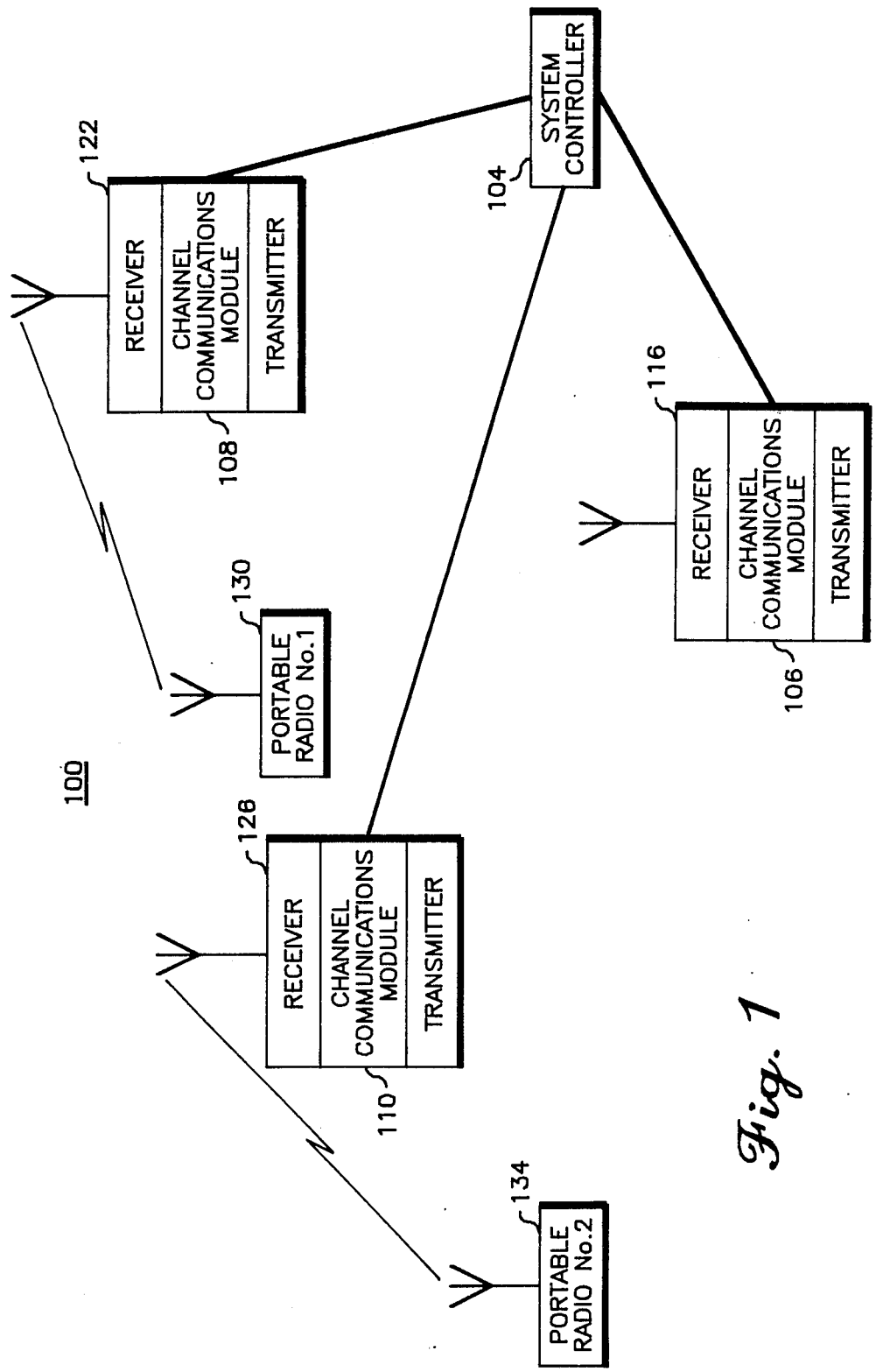
FIG. 1 is a block of a data communications system that may advantageously utilize the present invention.
Figure 2:
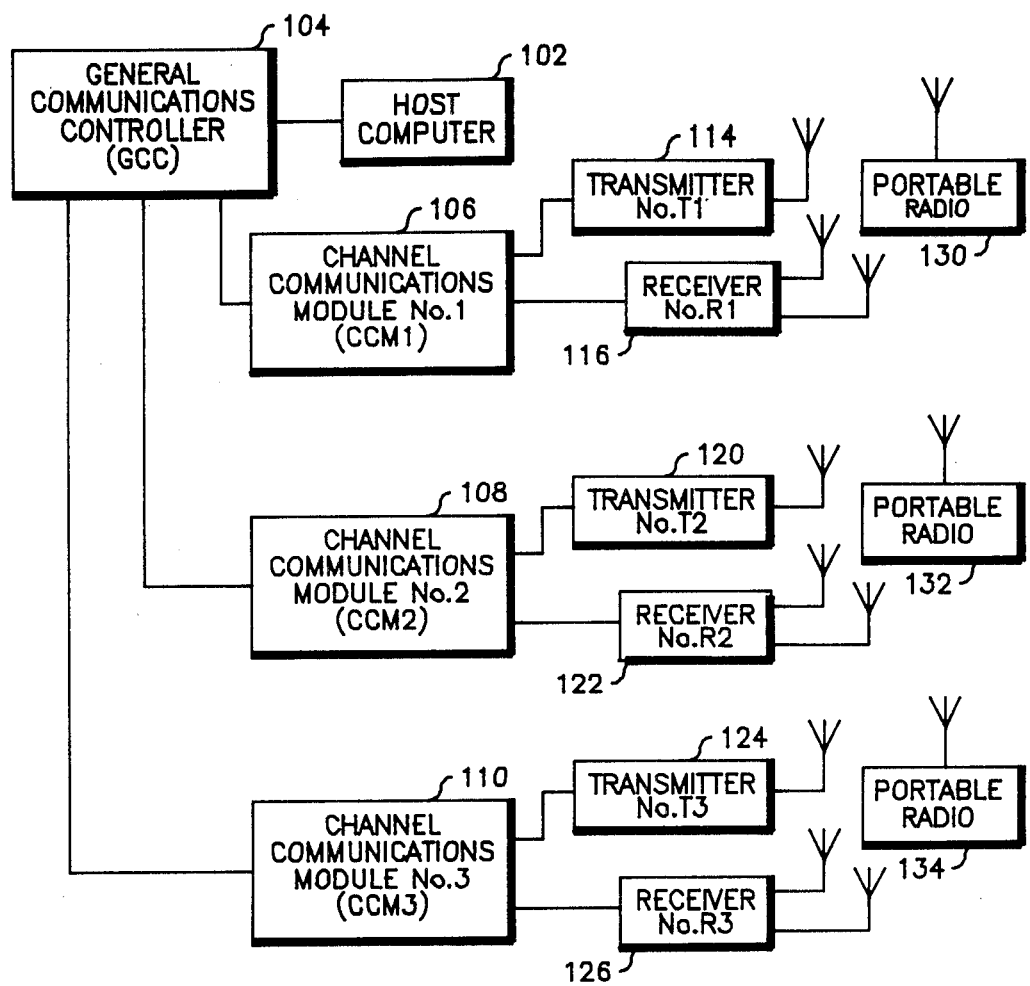
FIG. 2 is another block diagram of a data communications system that may advantageously utilize the present invention.

Refering now to FIGS. 1 and 2, there is shown a block diagram of a data communications system of the type which may advantageously utilize the present invention. This type of system communicates message signals between a primary station, such as a general communications controller (GCC) 104, by way of a communications medium such as a radio frequency (RF) communications channel to a plurality of remote stations, such as portable radios 130, 132, and 134. Although described in the context of a data only communications system, both data signals and analog signals such as voice can be communicated over the RF communications channel to the portable radios 130, 132, 134. Since the data communications system covers a larger geographical area than can be covered with a single base station site, there is a need for a plurality of such sites. Located throughout the geographical area are a number of base station sites each including a channel communications module (CCM) 106, 108, and 110, a RF signal transmitter 114, 120, and 124 and a RF signal receiver 116, 122, and 126, respectively. These transmitter/receiver pairs 114 & 116, 120 & 122, and 124 & 126 may operate on separate or the same antenna systems located therewith.

The RF communication channel is preferably comprised of first an second carrier signals which may be modulated with message signals. Transmitters 114, 120 and 124 may be operative on the first carrier signal, while receivers 116, 122 and 126 may be operative on the second carrier signal of the radio communications channel. Transmitters 114, 120, and 124 and receivers 116, 120, and 126 may be any suitable commercially available transmitters and receivers such as those described in Motorola Instruction Manual 68P81013E65, 68P81060E30 or 68P81049E45. CCM's 106, 108, and 110 are typically colocated with their corresponding transmitters and receivers and may be of the type shown and described in Motorla manual no. 68P81063E30.

Portable radios 130, 132, and 134 and preferably portable radios of the type shown and described in Motorola manual no. 68P81035C35, or may be commercially available mobile radios or hand-held portable radios of the type shown and described in U.S. Pat. Nos. 3,906,166 and 3,962,553 and in U.S. patent application Ser. No. 187,304, entitled "Microprocessor Controlled Radio-Telephone Transceiver", filed Sept. 15, 1980 and invented by Larry C. Puhl et al (all incorporated herein by reference). Portable radios 130, 132 and 134 may be any suitable commercially available conventional transmitter and receiver, such as, for example, the receiver described in Motorola instruction manuals no's. 68P81035C35, 68P81039E25 and 68P1014C65. These and the aforementioned Motorola Instruction Manuals are incorporated herein by reference and may be obtained from the Service Publications Department of Motorola, Inc., 1301 East Algonquin Road, Schaumburg, Illinois or From Motorola C & E Parts, 1303 East Algonquin Road, Schaumburg Ill.

GCC 104 of the data communications system in FIG. 1 may be coupled to a host computer 102 which may control a number of GCC's 104 that are located in different geographical areas such as, for example, different cities. Thus, host computer 102 may gather data from, and dispatch data to portable radios located in several different cities. GCC 104 may be coupled to host computer 102 and CCM's 106, 108 and 110 by means of commercially available modems and associated dedicated telephone lines.

GCC 104 in FIG. 1 transmits message signals to and receives message signals from portable radio's 130, 132, and 134. The message signals may include data packets which each may contain a binary preamble, a predetermined synchronization word and an information word containing a command, status or data. The format of the data packets is preferably that described in the instant assignee's U.S. patent applications Ser. No. 402,682, entitled "Data Signalling System", filed July 28, 1982 and invented by Timothy M. Burke et al.; Ser. No. 512,801, entitled "Method and Apparatus for Communicating Variable Length Messages", filed July 11, 1983 and invented by Jay Krebs et al.; and in Ser. No. 512,800, entitled "Method and Apparatus for Coding Messages communicated Between A Primary Station and Remote Stations of a Data Communication System", filed July 11, 1983 and invented by Thomas A. Freeburg et al., all incorporated herein by reference. Other suitable data formats may be any of a number of existing data formats, such as, for example, those described in U.S. Pat. Nos. 3,906,445, 4,156,867 and 4,354,252, all incorporated herein by reference.

Message signals are routed by GCC 104 to a selected CCM 106, 108 and 110 for transmission by its corresponding transmitter. Since the message signals may be transmitted on one or several transmitters simultaneously, as in simulcast systems of the type U.S. Pat. No. 4,188,522, it is necessary that GCC 104 have a means for determining which of the base station transmitters 114,120, or 124 should be used to deliver message signals to selected portable radios 130, 132, or 134. The improved method and apparatus of the present invention enables the receivers 116, 122, and 126 to dynamically alter the receiver sensitivity threshold so that RF signal strength readings are sufficiently accurate to permit meaningful comparative analysis of data received from many different location, thus enabling the GCC 104 to dynamically make these routing decisions.

According to an important feature of the present data system, two or more of the transmitters 114, 120, or 124 can be operated simultaneously for communicating with different portable radios provided that transmissions from the interfering transmitters do not interfere with reception by each portable radio receiver of its desired signal. As a result, data throughput of the data communications system illustrated in FIGS. 1 and 2 can be significantly increased by re-use of the RF communications channel. In other words, by taking advantage of re-use, a single RF communications channel can serve thousands of portable radios in a geographical area covering several states and their major cities.

Figure 3:
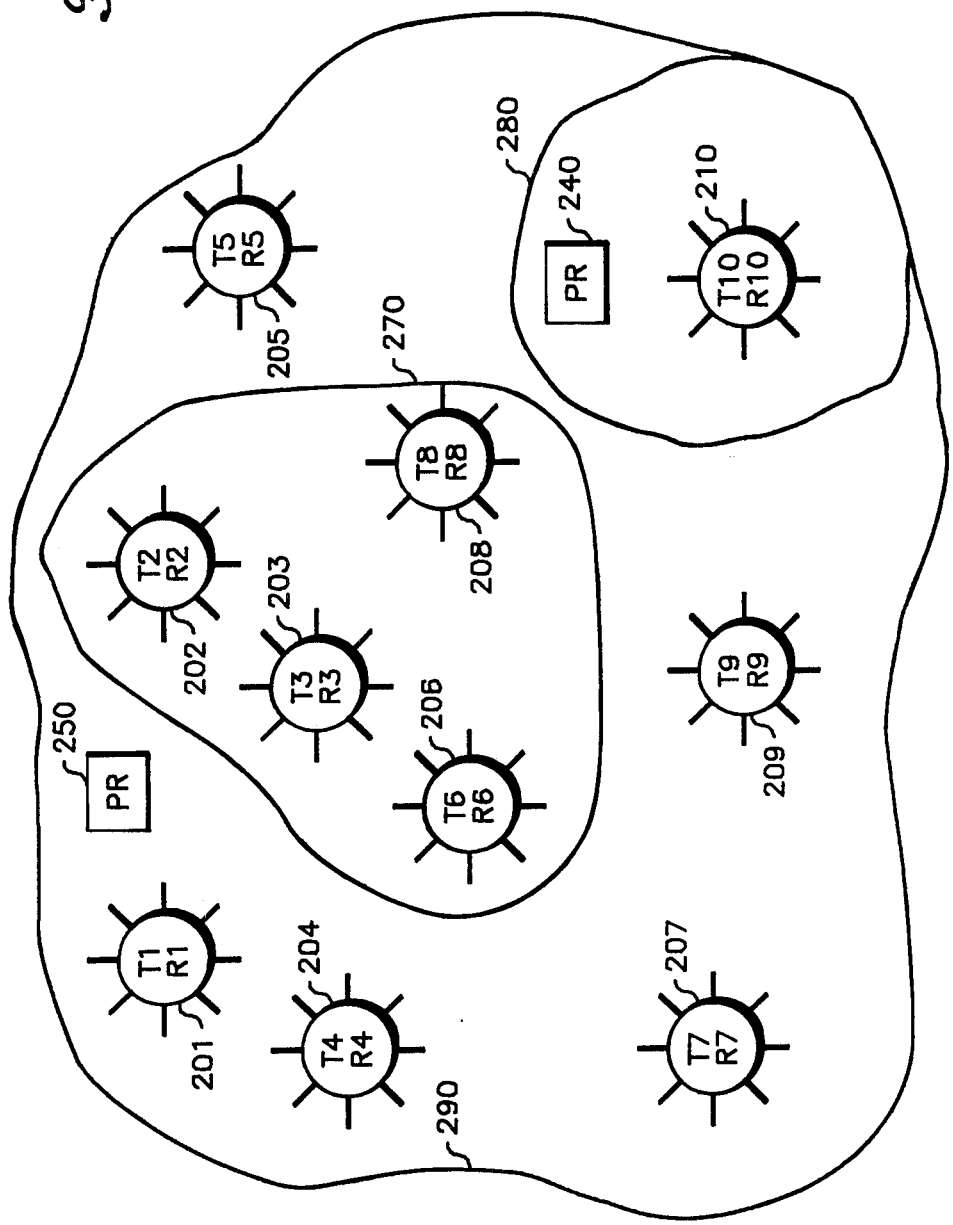
FIG. 3 is a diagram of a geographic area covered by ten base stations.

Refering to FIG. 3, there is illustrated a geographical area 290 of a data communications system that includes ten base station sites 201-210 and corresponding colocated transmitters T1-T10 and receivers R1-R10. Also shown are two portable radios 240 and 250. Each time a portable radio transmits, signal strength readings are taken by receivers R1–R10. These signal strength readings are transferred by the CCMs for each site 201–210 to GCC 104.

According to the teachings of the present invention, the signal strength readings SSI taken by receivers R1–R10 in FIG. 2 can be used to estimate the radio channel path loss between the portable radios and the base station sites 201–210 by subtracting the signal strength levels SSI received by the base station receivers from the portable radio transmitter power (a known number preprogrammed into the GCC). Signal strength readings are power levels and are preferably expressed in decibels or alternative logarithmic weighting. GCC 104 can combine this path loss estimate with programmed information pertaining to base station transmit powers, antenna configurations etc., to determine the signal strength or power level RSS each transmitter T1–T10 is able to deliver each portable radio receiver.

It should be recognized that the assumption of inbound/outbound loss reciprocity is only approximately valid. In general, path losses are comprised of three elements: the median distance related component; the lognormally distributed small sector variations (including building losses); and the Rayliegh distributed losses which result from RF multipath fading. Realistically, it must be assumed that the inbound and outbound multipath contributions are not equal, for these can change fairly rapidly with RF frequency, and the inbound and outbound radio channel frequencies are not the same (in the preferred embodiment they differ by 45 mHz). The lognormal and median or Okumura type path loss contributions should be reciprocal, so long as the portable radio location is not significantly altered between time of collection of the inbound signal strength data and the time the outbound response is sent. Hence the use of inbound path loss measurements as a means for projecting corresponding outbound path losses is not precise. Rather, it should be thought of as an estimating tool with statistical uncertainty. Furthermore, the channel protocol makes provisions for repeat transmissions which will help to mitigate any of the effects of any sub-optimal choices resulting from this statistical uncertainty.

The path loss estimates can next be used to determine which of the transmitters T1–T10 are capable of delivering to the target portable signal power of sufficient level to exceed that target radio's receive sensitivity. Where several alternative choices are possible, these can be prioritized in accordance with parameters preprogrammed below. When the selected transmitter (eg. T10) is capable of delivering a signal power level which is significantly in excess of the target portable radio's (240) receive sensitivity it may be possible to operate additional base station transmitters (say T2) simultaneously to deliver unrelated message traffic to other portable radios (such as 250). The path loss estimates can be used to access the interference impact of transmitter T2's transmission on the communication in progress between base site 210 and the target portable radio 240. Before GCC 104 will allow base site 202 to transmit to portable radio 250, it must first determine that transmitter T2 will not excessively interfere with the transmission in progress between T10 (at base site 210) and target portable radio 240. Since GCC 104 has recent estimates for the radio channel path loss between base site 210 and portable radio 240, and additionally has path loss estimates for the base site 202 to portable radio 240 path, GCC 104 is able to compute the signal to interference level $S/I_{EST}$ which portable radio 240 would see if transmitter T2 is activated. Additionally the interference impact of site 210 on portable radio 250's reception of its desired message from base site 202 must be assessed through calculation of its S/I level. If both S/I levels exceed a predetermined level programed into the GCC 104, transmitter T2 will be allowed to become active while transmitter T10 is still transmitting. If one or both of the S/I levels does not exceed this predetermined level, then transmitter T2's transmission must wait until the transmission from transmitter T10 is completed.

The ability of the GCC 104 to estimate S/I levels at multiple target portable radio locations in the presence of multiple simultaneous base station transmissions allows the GCC to schedule base station transmitter activity for maximum effectiveness, which results in much increased system throughput over what would be achievable if only one base station were allowed to be active at a time.

The preceding paragraphs describe a system implementation in which all possible base station activity states are permissible, and the interference relationships are specifically determined at the time of each individual remote station to primary station transmission. For system implementations in which the number of base station transmissions is large, the GCC's processing load can be significantly reduced by constraining the allowed base station transmitter activity states to specified set of zones. In this context, each base station transmitter would have a number of zones associated with it. In one embodiment, each base station transmitter has three zones, a first called a secondary reuse state, a second called a maximum coverage state and a third called a maximum reuse state. As an example, for a data communications system containing ten transmitters as shown in FIG. 2, zone Z1 could be defined as transmitter T1 active (to deliver a message to a selected portable radio station), and transmitters T2, T3, T4 inactive to prevent interference. An active transmitter is radiating a RF carrier signal and an inactive transmitter is not. As herinabove defined, zone Z1 is a secondary reuse state. A second zone Z2 could be defined as transmitter T1 active, and all additional transmitters T2, T3, T4, T5, T6, T7, T8, T9, T10 inactive. Zone Z2 is a maximum coverage state since all but one transmitter is inactive. Zone Z2 is a maximum coverage state since all but one transmitter is inactive. A third zone Z3 could be defined as transmitter T1 active, and none of the other transmitters need be inactive. Zone Z3 is a maximum reuse state. Each of the ten base station transmitters T1–T10 would typically have three zones associated with them, such that the total number of zones or base station activity states would be thirty. Such a set of zone definitions would reside in a table in GCC 104.

A table in GCC 104 specifies for each zone entry which transmitter (or group of transmitters in a simulcast implementation) would be activated to transmit the desired message to the target portable radio, and which corresponding set of transmitters must be inactive for the duration of the message to reduce co-channel interference to a tolerable level. As discussed previously, this decision would be based upon an analysis of RF signal levels received during a recent transmission from the target portable radio.

As an example, refer to FIG. 3 and consider a possible zone structure in which transmitter T10 is the active site from which the desired message is to be transmitted to the target portable radio 240. The area 280 is the are in which transmitter T10 can provide RF coverage with a prescribed level of reliability (say, 90% reliability), given that no co-channel interference is allowed to occur. This zone can be defined as the maximum coverage state that transmitter T10 and will be defined by the activity state: T10 is active; all other transmitters are inactive. Actually, this requirement can be made less restrictive by recognizing that certain sites are so far removed from transmitter T10, that they will cause little if any interference whether they are on or off. Assume sites 201, 202 and 204 fall into this category. With this relaxation, the maximum coverage zone can now be defined by the activity state, T10 is active, and cochannel activity is allowed on T1, T2 or T4. All other sites must be inactive.

A second zone which can be defined for transmitter T10 is the maximum reuse state. This zone is defined such that co-channel activity can be allowed on all other transmitters (neighboring and otherwise) while the desired message is being transmitted from site 210 to the target portable 240. This essentially says that the portable radio is so close to site 210 that its signals will capture any possible interference. Again, this determination can be reliably predicted by an analysis of the RF signal levels received at the various base station sites 201-210 during a recent transmission from the target portable radio.

Additional reuse zones can be defined as well. Assume a secondary reuse state is defined by inhibiting transmitter activity at adjacent sites only. For this zone the transmitters T8 and T9 must be inactive. All other transmitters may be used for cochannel activity. This zone choice would provide adequate coverage to most portable radios inside the RF coverage area 280. The primary exceptions would be any portable radios operating on high hills or in the upper stories of large buildings which might be susceptible to interference from far off base station sites. Use of this secondary reuse state would allow for significantly more co-channel reuse than would the maximum coverage state described previously.

What is disclosed in the foregoing paragraphs is a method of simplifying the implementation of the generalized transmitter selection/inhibit scheme described above. Here, the number of allowed transmitter activity states has been reduced from "all possible permutations" to a defined "set of Zones" (typically three zones per transmitter site). In this context, a zone should be thought of as a transmitter activity state, not a geographic area. RF propagation characteristics are best defined in terms of statistical parameters and time variations. A portable radio could remain geographically fixed within a several square foot area, and yet "move" from zone to zone as propagation characteristics change over time or in response to small repositioning of the portable radio. This entire selection process is predicated on deciding which of a defined and allowed set of transmitter activity states (or zones) is capable of providing an RF propagation environment for reliably delivering the desired outbound message. This decision is based upon a evaluation of signal strength levels measured at all responding base station sites during recent transmissions from that target portable radio. In the event that more than one zone selection alternative is available, the communications controller will select the smallest (in a geographic sense) of the alternatives using a zone prioritization algorithm programmed into the system controller that maximizes reuse.

The first step in the transmitter selection process is to assess which base station transmitters can be used to deliver a message to the target portable radio. Any base station transmitter which is capable of delivering an RF signal whose deliverable signal strength or power level at the portable radio's location will exceed the portable radio's receiver signal strength is a reasonable candidate for selection. The zones which satisfy this requirement are the maximum coverage zones for the associated base station sites. When evaluating the reuse zones which allow for simultaneous transmitter activity at multiple base station sites, the signal to interference level at the target portable radio's location is computed for each reuse zone, preferably using the worst case assumption that all transmitters are active unless inhibited for that zone. In this case each zone for which the computed signal/interference level exceeds a predetermined capture threshold for the portable radio receivers (preprogrammed constant stored in GCC 104) can be selected for delivering the message. Thus, the interference due to other simultaneously active transmitters is taken into account when allowing reuse. Alternatively, only currently active transmitters can be taken into account when evaluating reuse zones.

In applications where co-channel reuse is of major concern, site selection alternatives can be further prioritized in terms of geographic coverage area. Hence, where several alternatives are available, these alternatives will be selected such that the base station transmitter site having the smallest geographic coverage area is selected first. In this case, the transmitter having the largest deliverable signal strength is not selected, but rather the transmitter which provides adequate deliverable signal strength and also allows maximum cochannel reuse is selected. This prioritization can be based upon look-up table entries contained in the GCC's data base. For example, transmitter T3 having coverage area 270 may be weighted one, while transmitter T10 having coverage area 280 may be weighted seven. These weighted or adjusted signal to interference levels are then rank ordered, and the zones or transmitter activity states associated with the top two adjusted S/I levels are selected as the primary and secondary zones to be used when next attempting to deliver a message to the target portable radio.

As an outcome of the analysis, the signal interference level for each base station activity state or zone will be estimated using the path loss estimates determined during recent transmissions from the target portable radio. Each zone for which the signal/interference level is sufficiently large to assume high likelihood that the portable radio would receive the scheduled outbound message is identified. These candidate zones are then prioritized so as to give precedence to transmitter activity states or zones which allow higher degrees of co-channel reuse. Hence base station sites which provide greater geographic coverage (mountain top sites, sites with very high towers of sites on tall buildings) are given minimal weighting. Sites operating from low buildings or towers, which provide more localized coverage, are given much higher weighting. That is, site 203 may be weighted one, while site 210 may be weighted seven. Additionally, zone configurations which require inhibiting few or no transmitters (maximum reuse or secondary reuse) are given higher weighting than are zone configurations which require the inhibiting of many transmitter sites (such as coverge zones).

After this analysis and prioritization, the two zones or transmitter states having the largest adjusted signal to interference level for the last transmission received from each portable radio are stored in the memory of GCC 104. When GCC 104 receives a message from host 102 to be delivered to one of the portable radios 130, 132, or 134, GCC 104 will transmit this message in the zone which has the largest adjusted S/I level for the last transmission from the portable radio. If the portable radio does not acknowledge the transmission of the message signal, GCC 104 may attempt one or more retransmissions of the message signal by means of that selected tranmitter state or zone. If the retransmissions likewise are not acknowledged by the portable radio, GCC 104 may then transmit the message signal via the transmitter covering the zone which had the second largest adjusted signal to interference level for the last transmission from that portable radio. Again, if the portable radio does not acknowledge the transmission, GCC 104 may resend the message signal one or more times by means of that selected transmitter. If GCC 104 does not reach the selected portable radio by means of these two transmitters, it may next select the zone used for the last successful communication with that portable radio. If GCC 104 does not reach the selected portable radio after one or more attempts in this zone, it may either select another transmitter covering that portable radio's "home" zone, or intiate a polling sequence in which the selected portable radio is polled in every zone or a subset of all zones in the data communications system starting with the portable radio's "home" zone or simultaneously in all or groups of zones.

Figure 4:
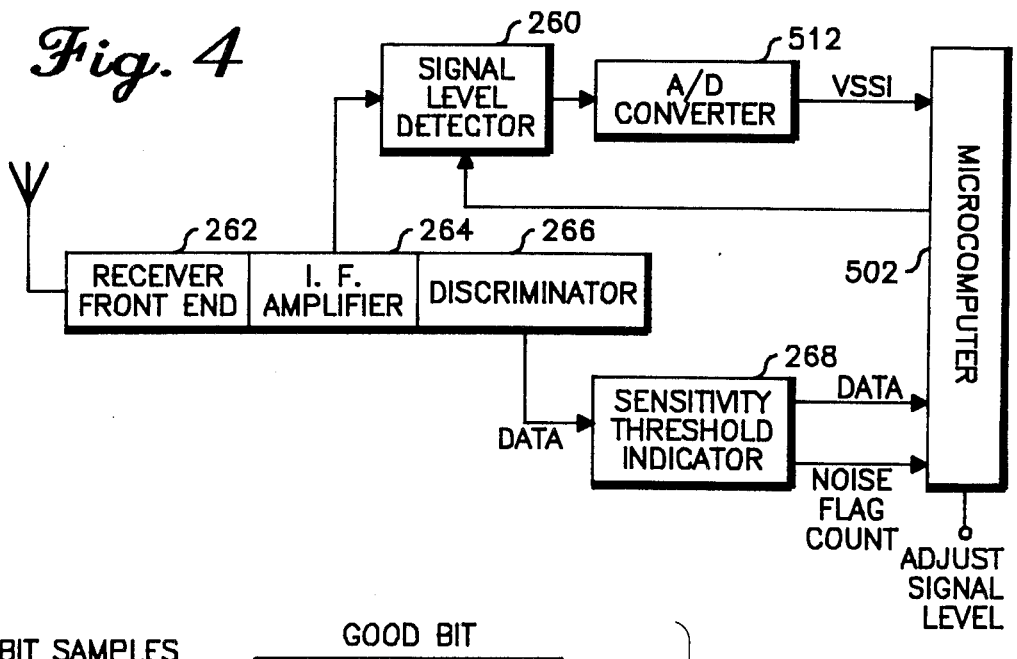
FIG. 4 is a block diagram of the circuitry of the receiver and adaptive signal strength detector of the present invention.

Refering now to FIG. 4, there is shown a block diagram of the circuitry of a receiver such as receivers 116, 122, and 126 and the adaptive signal strength detector of the present invention. As mentioned in conjunction with the explanation of the data communications system of FIGS. 1, 2, and 3, receivers 116, 122, and 126 of FIG. 2, require very accurate signal strength measurements so that the data communications can be routed to the proper transmitter, and so that frequency reuse is available when allowed by the constraints of co-channel interference. Conventional signal strength measuring circuits provide output signals which are influenced by the effects of component aging as well as the manufacturing tolerances of the components used to assemble the circuits themselves. If accurate signal strength measurements are required, attempts are made to minimize the variations to an acceptable level by placing stringent requirements on components and by using temperature compensation techniques. The present invention provides for a self-calibrating signal strength detector which eliminates the effects of component variation and aging by utilizing a highly stable narrow dynamic range signal strength detector to calibrate the signal strength threshold of a wide dynamic range circuit.

Figure 9:
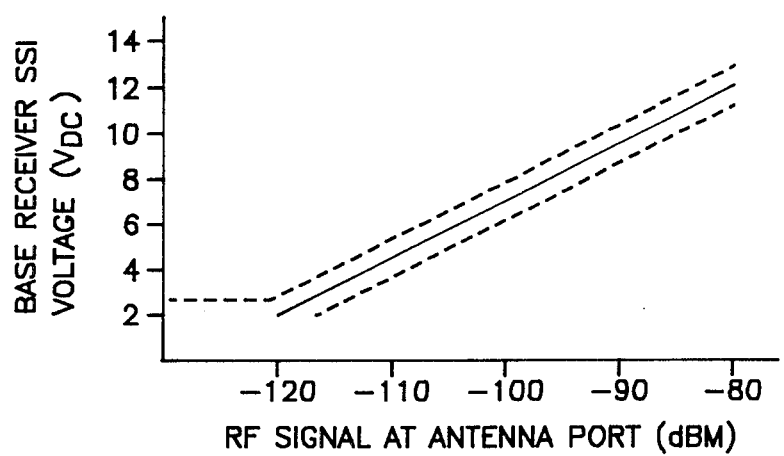
FIG. 9 is a graph detailing the relationship beteen RF signal level and the desired response at the output of the signal strength indicator circuit constructed in accordance with the teachings of the present invention.

The receiver circuit of the present invention consists of a receiver front end 262, an I.F. amplifier 264, and a discriminator 266. The receiver shown in FIG. 4 is conventional in nature and will be described in more detail in conjunction with FIG. 6. The adaptive signal strength detector of the present invention is comprised of three elements which interface with the receiver circuit abovementioned. An RF signal level circuit, An RF sensitivity threshold indicator, and a processing device which analyzes the output signals of the two circuits above and uses that information to calibrate the threshold point of the RF signal level circuit. The RF signal level circuit 260 is characterized by a logarithmic response. In addition, the RF signal level circuit is characterized by the relationship shown in FIG. 9, details shows the relationship between between the RF signal at the antenna port and the voltage at the output of the signal level circuit. In the preferred practice of the present invention, the RF signal level circuit 260 has a dynamic range of approximately 40 dB. The RF signal level circuit 260 receives its input signal from the receiver IF amplifier stages 264. The output of RF signal level detector is coupled to an A/D converter 512 which provides a binary representation of the RF signal level signal to microcomputer 502.

The RF sensitivity threshold circuit is defined as one which can be used to identify signal levels which are at or near the sensitivity threshold of the receiver system. The RF sensitivity threshold indicator of the present invention provides the following functions; low pass filtering, Bit sync Recovery, Word sync Recovery and generation of noise flags, which will be discussed more fully below. In the preferred practice of the present invention, the receiver sensitivity threshold is defined as being equal to that signal level which produces a received bit error rate which is approximately 1%.

The data processing device of the present invention collects and averages measured samples of signal strength data provided by the A/D converter 512 and the sensitivity threshold indicator 268, and is further capable of determining from the RF sensitivity threshold indicator's output signal which RF signal strength samples are at the receiver sensitivity threshold, and using that information to calibrate the threshold point of the signal level detector 260. The calibration adjustments may be arithmetic adjustmenys to the digitized output from A/D converter 512 or alternatively, may take the form of feedback from microcomputer 502 to the signal level detector 260. The detailed operation of these circuits is explained more fully below.

Figure 5:
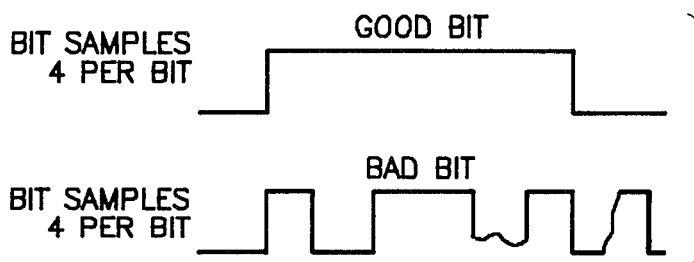
FIG. 5 is a timing diagram describing the method of deriving bit quality information used in accordance with the practice of the present invention.

Refering now to FIG. 5, there is shown a timing diagram describing the method of deriving bit quality information which is utilized by the sensitivity threshold indicator 268 of FIG. 4. As mentioned above, the receiver sensitivity is defined as that signal level which produces a bit error rate of approximately 1%. The present invention utilizes a bit quality scheme to detect when a received signal is at or near the receiver sensitivity threshold. According to FIG. 5, each incoming data bit is sampled four times and each of the samples is compared to determine whether a specific bit is "good" or "bad". A detailed explanation of the bit sampling scheme follows hereinbelow in conjunction with the explanation of FIGS. 7 and 8. Briefly however, if a bit is "bad" or suspect, the present invention provides that a "noise flag" be generated to indicate that this particular bit is corrupt. Each bit is sampled once at the bit boundary (this sample is used for bit synchronization), once at the center of the bit (this sample is used to determine the sense of the bit, i.e., is it a "1" or a "0", and twice more; once at the 25% point and once at the 75% point. These later two samples are used to develop noise flags. If samples S2, S3, and S4 are all identical, then the bit is assumed to be of good quality. If either S2, S4, or both S2, and S4 differ from S3, then the quality of the received bit is suspect and a noise flag is generated.

Figure 10:
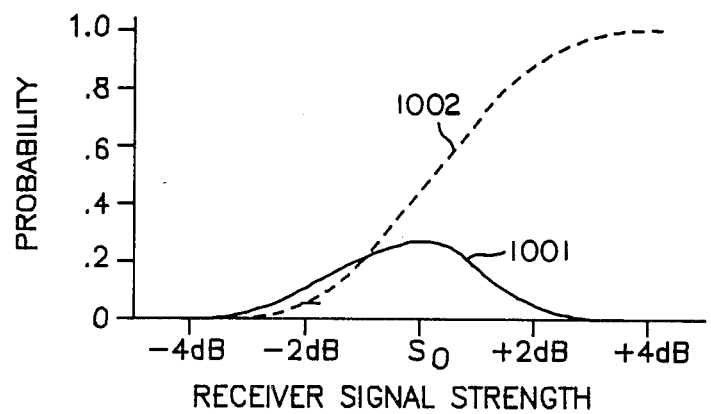
FIG. 10 is a graph detailing the relationship between the the signal strength at the receiver and the probability of generating bad data flags with the bit noise flag generator shown in FIG. 8.

This noise flag generation scheme can be thought of as an rF signal strength detector of very limited dynamic range. If the RF signal is only slightly greater than the receiver sensitivity threshold, then the probability of noise flag generation will be very low; a 1% bit error rate signal will produce noise flags for between 2 and 3% of the bits; and if the bit error rate is 50% (pure noise into the flag generator), a flag rate of about 40% will result. The exact relationship between the output of the signal level detector 260 and the probability of a generated noise flag is shown in FIG. 10.

Figure 6:
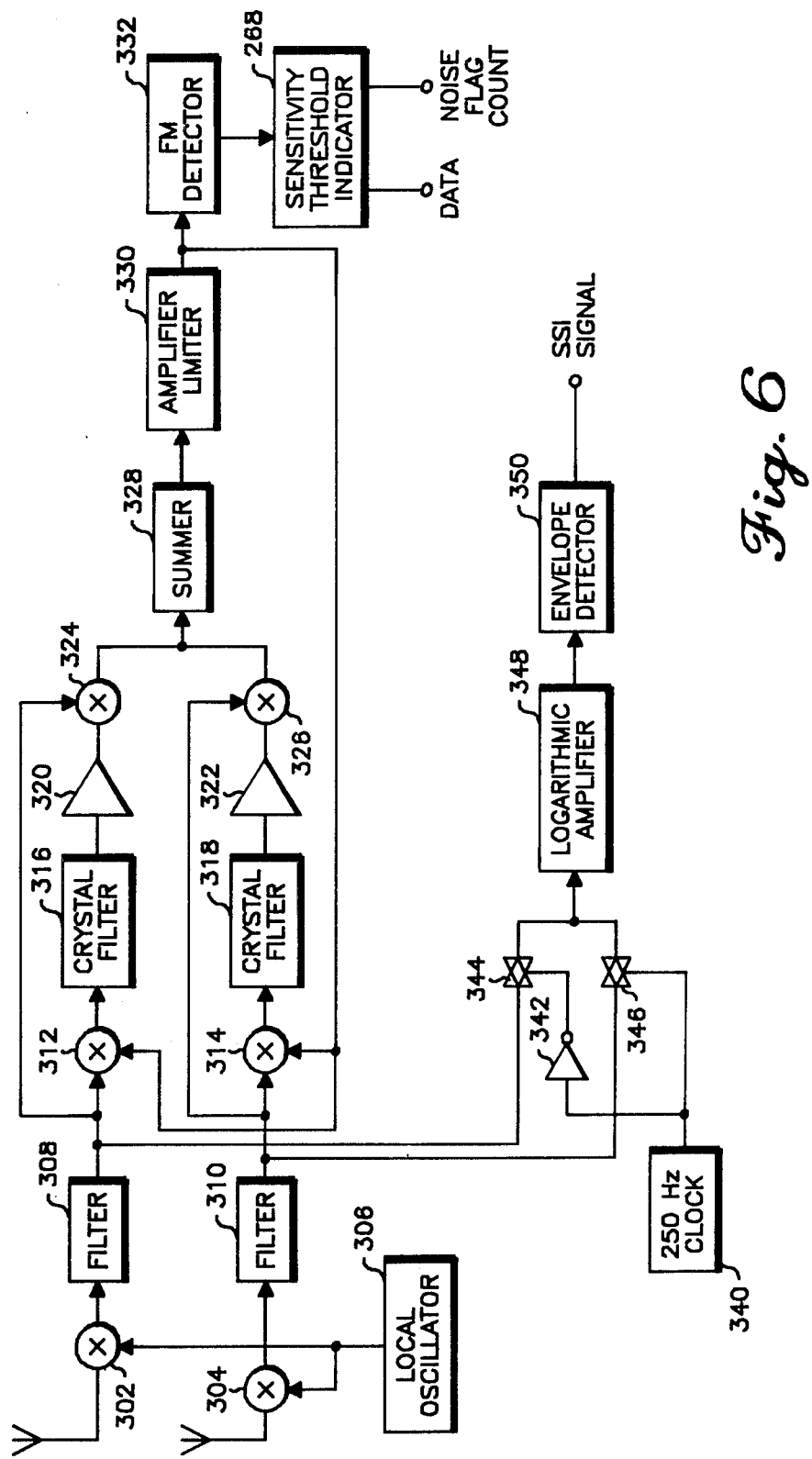
FIG. 6 is a block diagram of the circuitry of the base sation receivers of FIG. 2.

Refering now to FIG. 6, there is illustrated a detailed circuit diagram of the base station receivers 116, 122, and 126 associated with CCM's 106, 108, and 110 in FIGS. 1 and 2. Each receiver preferably includes two antennas spaced at a predetermined distance from another and a maximal ratio predetection diversity combiner 312, 314, 316, 318, 320, 322, 324, 326 and 328 for combining the signals received by each of the antennas. The space diversity provided by the two antennas is utilized to prevent degradation in communications which results when an antenna is located in an RF signal null. Although optional, the use of diversity minimizes reception of errors in the incoming data and also enchances accuracy of the path loss estimates since it reduces variations on signal levels. Rapid and deep RF signal nulls, called Rayleigh fading, are experienced more frequently in communications systems operating at RF signal frequencies in the new 800 to 900 mHz frequency range. The maximal ratio predetection diversity combiner cophases the RF signals from each antenna and linearly adds the cophased signals to provide a composite signal having components that are proporational to the square of the RF signals from each antenna. Therefore, strong signals are emphasized much more than weak signals. In other words, communications are not adversely affected if a very weak signal is receive by one antenna and a reasonably good signal is received by the other antenna.

In the diversity receiver in FIG. 6, the frequency of local oscillator 306 determines which radio channel to which the diversity receiver is tuned. The RF signal received by each antenna is combined by mixers 302 and 304 with the signal from local oscillator 306 to provide corresponding IF signals. The IF signal from mixers 302 and 304 is then applied to IF bandpass filters 308 and 310, respectively, which may be a monolithic bandpass filter of conventional design similar to that described in U.S. Pat. No. 3,716, 808 (incorporated herein by reference). The filtered IF signals from filters 308 and 310 are split and fed forward via two paths to mixers 312, 324 and 314, 326, respectively. First portions of the IF signals are applied to mixers 324 and 326, and second portions of the IF signals are applied to mixers 324 and 326, and second portions of the IF signals are applied to mixers 312 and 314 together with the composite IF signal which is fed back from amplifier 330. By feeding back the composite IF signal, the IF strip of the diversity receiver forms a closed feedback loop that is regenerative on noise. Thus, the randomly varying phase of the IF signals from filters 308 and 310 relative to the composite IF signals is added into the closed loop via mixers 312 and 314 and then subtracted out at mixers 324 and 326, respectively. By this process, the random phase variations are removed from the IF signals in relation to the composite IF signal. The result is that each of the IF signals is cophased to the composite IF signal.

The product signals from mixers 312 and 314 at the difference frequency are applied to filters 316 and 318, respectively, which each provide a variable phase shift. Filters 316 and 318 may be two-pole crystal filters. The signals from filters 316 and 318 are linearly amplifed to the second input of mixers 324 and 326, respectively. Mixers 324 and 326 multiply the signals from amplifiers 320 and 322, respectively, with the IF signals from filters 308 and 310, respectivly, to provide product signals that are cophased with the composite IF signal. The product signals from the mixers 324 and 326 are linearly added by summer 328 to form one composite IF signal. The composite IF signal may be coupled via amplifier 330 to a conventional FM detector 332 which has an output signal providing demodulated message signals. The output signal of FM detector 332 is coupled to its corresponding CCM 106, 108, or 110 in FIG. 1. The output of FM detector 332 is further coupled to the input of the sensitivity threshold indicator 268 of FIG. 4, in this case a bit noise flag generator which is described in detail in conjunction with FIGS. 5, 7, and 9. Further details of the circuitry in the diversity receiver in FIG. 4 are illustrated and described in the instant assignee's co-pending U.S. patent applications, Ser. No. 22,757 (now U.S. Pat. No. 4,369,520), filed on Mar. 22, 1979, entitled "Instantaneously Acquiring Sector Antenna System", and invented by Frank J. Cerny, Jr. and James J. Mikulski, and in Ser. No. 268,613 filed on June 1, 1981, entitled "Large Dynamic Range Multiplier for a Maximal Ratio Diversity Combiner", and invented by Frank J. Cerny Jr., both incorporated herein by reference.

FIG. 6 also illustrates the circuitry 340, 342, 344, 346, 348 and 350 comprising the signal strength detector that is located in the receivers. Logarithmic amplifier 384 is switchably coupled to the signals from filters 308 and 310 by clock 340 and gates 342, 344 and 346 and provides a composite signal which is coupled to envelop detector 350. Envelope detector 350 provides an SSI signal that is proportional to the maxima of the composite signal from amplifier 348 and also time averaged to smooth variations. Amplifier 348 should preferably be a long-amplifier to provide for both extended dynamic range and logarithmic weighting which simplifies the GCC computations. A separate amplifier 348 and envelope detector 350 can be provided for each of the signals from filters 308 and 310 if it is desired to measure each separately. The SSI signal from envelope detector 350 is coupled to its corresponding CCM 106, 108 or 110 in FIG. 1, where it is digitized. Suitable signal strength detecting circuitry is described in detail in the instant assignee's copending patent application Ser. No. 505,625, filed June 20, 1983, entitled "Diversity Signal Strength Indicator and Site Selection Apparatus for Using Same", invented by Karl R. Brusen, and incorporated herein by reference. Many other types of commercially available signal strength detecting circuitry can be utilized in place of clock 340, gates 342, 344 and 346, amplifier 348, and envelope detector 350.

Figure 7:
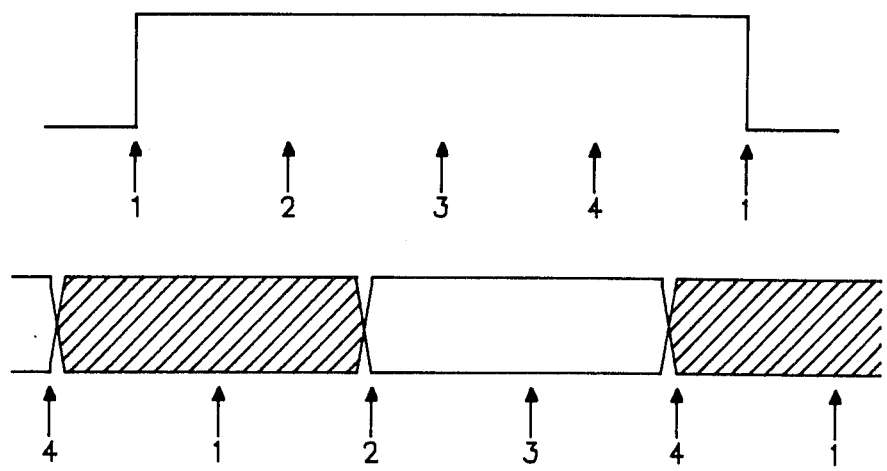
FIG. 7 is a timing diagram showing the sampling scheme used in accordance with the method described in conjunction with FIGS. 5 and 8.
Figure 8:
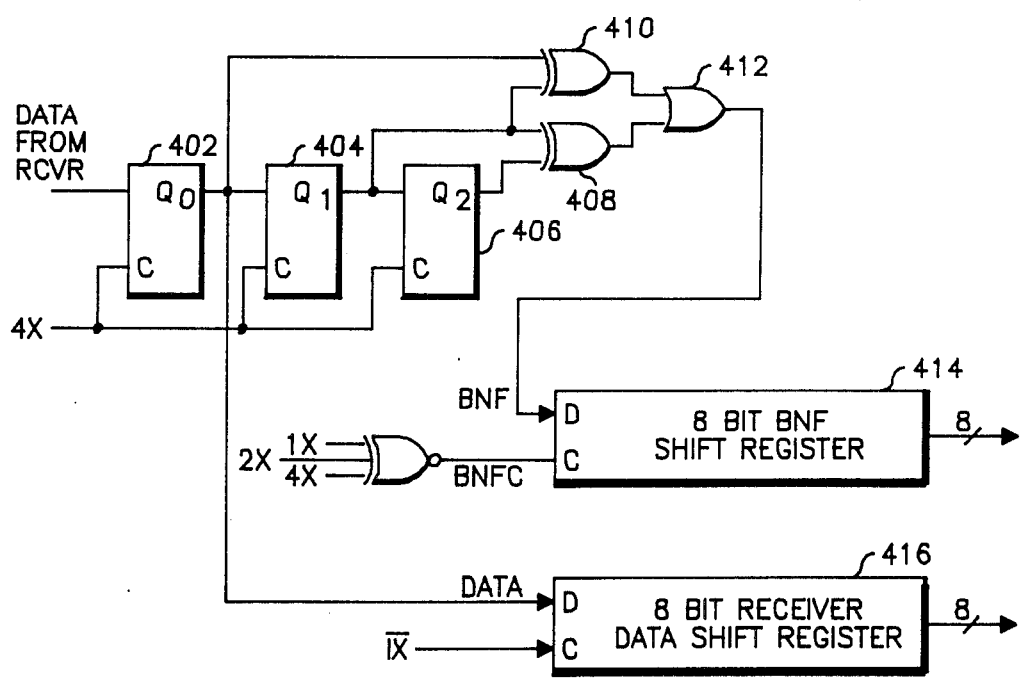
FIG. 8 is an electrical schematic showing the circuitry used to implement the bit quality sampling scheme used in accordance with the teachings of the present invention.

Refering now to FIGS. 7 and 8, there is shown a timing diagram and electrical schematic detailing the operation of the bit noise flag generator abovementioned in the discussion of FIG. 4, 5, and 6. As mentioned above, each incoming data bit is sampled four times. According to the present invention, a data bit of acceptable integrity is defined as having less than $\pm\frac{1}{4}$ bit transition time jitter.

FIG. 8 shows an electrical schematic of the circuitry used to implement the bit quality sampling scheme used in accordance with the teachings of the present invention. The bit noise flag generator circuit consists of a series of flip-flops 402, 404, and 406 which are configured as a 3 bit shift register. Samples are shifted into the three bit shift register at four times the data rate as shown by terminal 4X coupled to flip-flops 402, 404, and 406. The three outputs of this shift register provide the four sample per bit information required to recover clock and data and generate bit noise flags.

A separate circuit (not shown) decodes the data stream and produces a clock signal at the clock rate, a clock signal at twice the data rate and a clock signal at four times the data rate. The clock recovery circuit could be any conventional digital phase-locked loop configured to lock the detector clock onto the incoming data stream. The four samples occur on the rising edge of 4X serial data clock. The 1X and 2X clocks are derived from the 4X clock by simple divide by 2 stages. The 1X and 2X clocks are used to uniquely identify the position of the four samples as they are shifted through the 3 bit register.

The recovered data signal is derived from the output of flip-flop 402 and corresponds to sample 3 of FIG. 7. The data sample is then shifted to the 8 bit data register 416 on each falling edge of the 1X clock. The bit noise flag information is generated by logic gates 408, 410 and 412. The bit noise flag bit is shifted into the 8 bit BNF register 414 on the rising edge of the BNF clock (BNFC). This occurs when flip-flop 402 stores sample 4, flip-flop 404 stores sample 3, and flip-flop 406 stores sample 2. The Exclusive-OR gates 410, 408 and OR gate 412 are coupled so that they generate an output according to the logical relationship:

$$BNF = [2 \oplus 3] + [3 \oplus 4]$$

Figure 11:
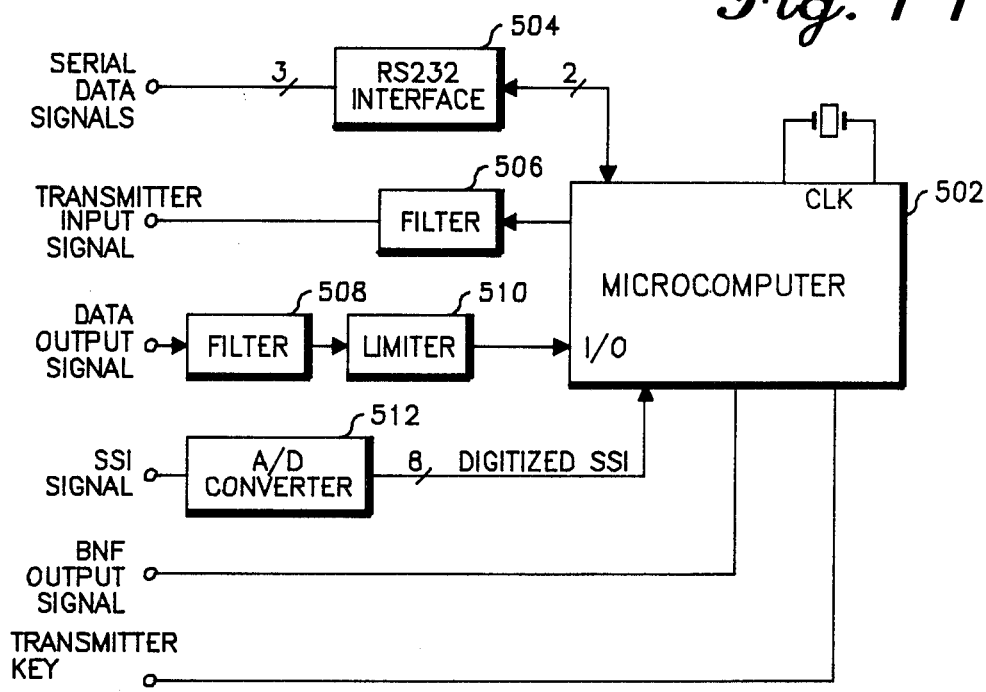
FIG. 11 is a block diagram of the data processing portion of the base station receiver shown in FIG. 2.

After eight data bits and the corresponding BNF bits have been shifted into the registers 414, 416, the information is transferred to buffer registers (not shown) which are accessed by the microprocessor 502 of FIG. 11.

FIG. 11 is a block diagram of the data processing portion of the base station receiver shown in FIG. 2. A mentioned above, each base station is provided with a receiver, transmitter, and CCM. Each CCM includes a microcomputer 502 having a memory with a stored program therein for communicating with GCC 104 and portable radios 130, 132 and 134 in FIG. 2. In addition, microcomputer 502 includes a memory with a stored program therein for implementing the adaptive signal strength detector of the present invention. Microcomputer 502 can be any suitable commercially available microcomputer such as, for example, the Motorola type MC6800, MC6803 or MC68000 microprocessor, of those mircoprocessors described in U.S. Pat. Nos. 4,030,079 and 4,266,270.

Microcomputer 502 is coupled to a RS232 interface 504 which may be coupled by a modem to a dedicated telephone line from GCC 104 in FIG. 1. Message signals received by microcomputer 502 from the GCC may be coupled in to filter 506 and thereafter applied to its corresponding base station transmitter. The transmitter is turned on (active) and off (Inactive) by means of a transmitter key signal provided by microcomputer 502. The message signals may be coded according to frequency-shift keying, phase-shift keying or any other suitable existing encoding scheme. Suitable message signal encoding schemes are described in the aforementioned U.S. Pat. Nos. 3,906,445, 4,156,867 and 4,354,252. Message signals received from portable radios by the base station receiver sensitivity threshold indicator or bit noise flag generator are coupled to a microcomputer I/O input.

Microcomputer 502 also takes signal strength readings while it is receiving its message signals. The SSI signal from its corresponding base station receiver is coupled to A/D converter 512, which may continuously convert the analog SSI signal to a digitized SSI signal. The digitized SSI signal from A/D converter 512 is applied to an input port of microcomputer 502. Several A/D convrsions are performed while a message signal is being received. The digitized SSI signal for the several conversions are averaged by microcomputer 502. The output of bit noise flag generator 268 is also coupled to an input port of microcomputer 502 which analyzes the bit noise flags in conjunction with the digitized SSI signal.

In the sampling process to be employed here, the processor will analyze the inputs once every $N = 56$ bits. During each 56 bit sample period, the processor will periodically read and develop a running average for the DC voltage produced by the wide range RF level detector ($V_{ssi}$) and will simultaneously accumulate a count of the total number of noise flags generated during the corresponding period. If the number of noise flags generated in any 56 bit period falls within a specified range, then the RF signal strength for that period can be considered to be at the threshold level. if the average of the signal strength data accumulated from the wide range detector does not properly reflect this, then a calibration adjustment can be determined to force the desired correspondence.

The signal strength calibration point for the narrow range noised flag detector circuit can be adjusted somewhat by varying the acceptance boundaries for the number of noise flags allowed in a 56 bit period. The relationship between received RF signal level and any specified noise flag condition can be expressed as a probability distribution function. FIG. 10 shows an empirically derived mapping of probability verses RF signal level received for the specified condition that one and only one noise flag is detected in 56 bits of received message data. Curve 1001 shows the probability density function, and curve 1002 shows the corresponding cumulative distribution function. This is the noise flag condition used in the preferred practice of the present invention. The signal level has been expressed in terms of dBs relative to the 1% bit error rate sensitivity of the receive system ($s_o$). When this specified noise flag condition is detected, the corresponding received signal should be distributed about a mean value of $S_o + 0.35$ dB with a 90% confidence interval bounded by $S_0 - 1.7$ dB and $S_o + 2.3$ dB.

At the end of every 56 bit period, the processor determines whether the noise flag count falls within the prescribed range. If it does not, then registers containing noise flag counts are digitized, averaged Vssi data are cleared and no threshold adjustments are made. If the number of noise flags does fall within the defined range, the averaged Vssi reading for the current period is assumed to be at the threshold level and this new value is used to adjust the contents of the register which contains the current estimate of the receiver sensitivity threshold. The actual averaging process used is weighted toward the older value. Additionally, if the averaged $V_{ssi}$ reading for the current period is much higher than the value contained in the sensitivity threshold register (>10 dB), then the new reading is considered to result from co-channel interference, not receiver noise, and hence is ignored.

In the course of normal system operation, the local processor averages the signal strength data (Vssi) over the duration of each received message. At the conclusion of each message, the processor adjusts it by subtracting the current contents of the threshold sensitivity register from the signal strength average accumulated over the message duration. This difference, which is proportional to:

$$\log_{10}[S/S_0]$$

where S=received signal power averaged over the message duration, and $S_0$=the base station threshold sensitivity, is appended to the received message and forwarded to the system controller where the transmitter site selection decision is made.

Figure 12:
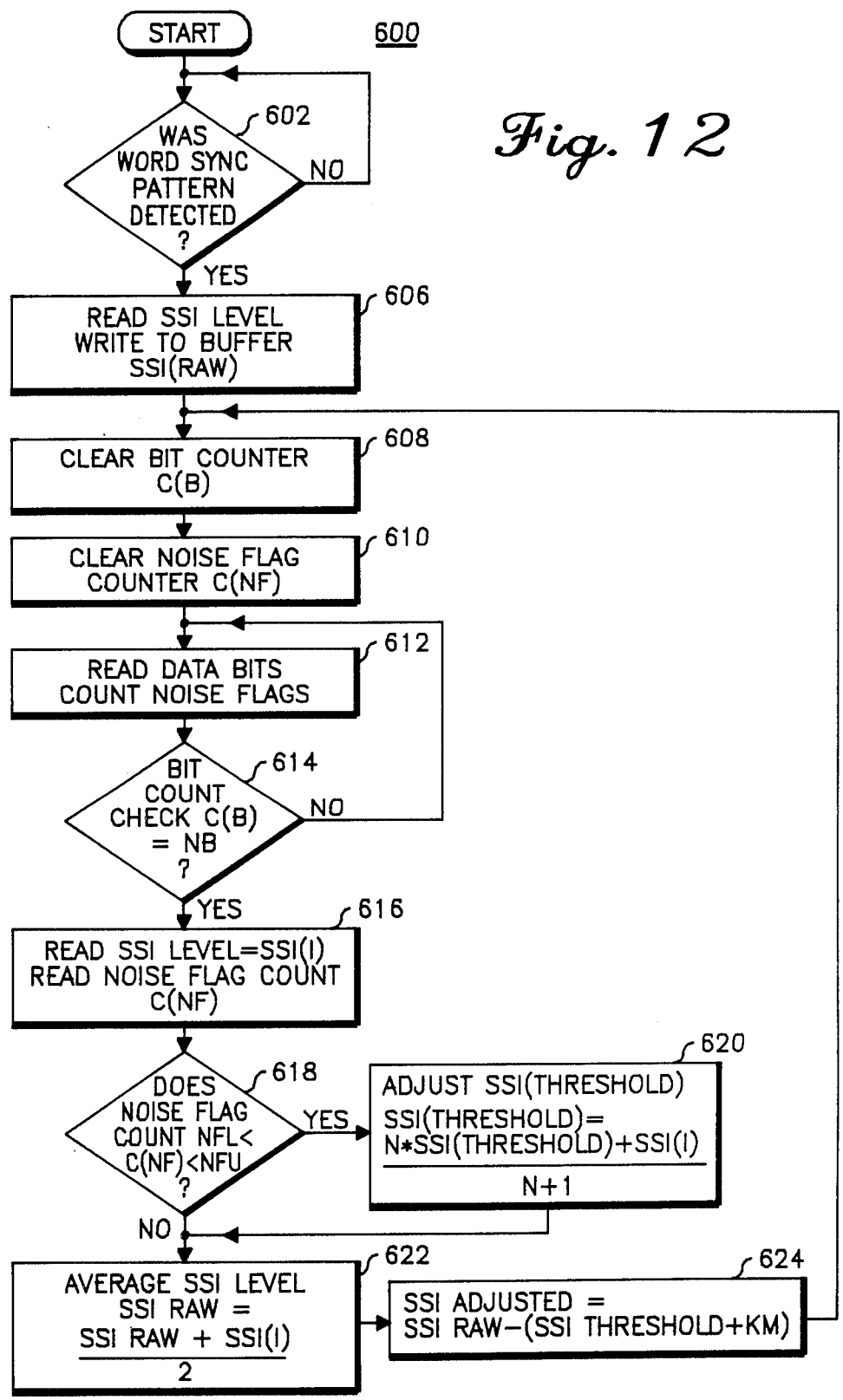
FIG. 12 is a flow diagram detailing the method by which the data processing device adaptively alters the receiver's threshold based on a received signal.

Refering now to FIG. 12, there is shown a flow diagram detailing the operation of the data processing device which adaptivly alters the contents of the receiver threshold register based on the signal strength threshold information. The routine 600 begins with decision 602 which illustrates the waiting period during which the CCM circuitry is looking for the 40 bit word sync pattern. Once the sync pattern has been detected, several buffers or counters are initialized. Item 606 reads the logarithmically weighted signal strength detectors digitized output and enters the data into a buffer designated SSI (raw). This buffer contains the raw or unadjusted signal strength level. Item 608 then initializes a bit counter C(B) which accumulates the number of received bits for the particular accounting period. Item 610 likewise clears a counter C(NF) which accumulates the number of noise flags bits generated during a particular period. After this initialization, data bits are read in as received. Item 612 reads the data bits and notes whether any of the data bits have been tagged by noise flags, indicating that the quality of the associated received bits may be suspect. A count of any noise flags received is accumulated in the noise flag counter C(NF).

Decision 614 examines the total bit count as each new data bit is received. If the number of bits received is less than a predefined level, NB, then the processor loops back to item 612 which reads another bit. If the bit count C(B) equals NB, then routine 600 breaks out of the loop by selecting item 616 which begin to read and adjust the SSI levels after which, routine 600 loops back to item 608 to clear the bit counter C(NF) for a new iteration. The SSI adjustment frequency is thus determined by the parameter NB, which in the preferred embodiment is 56 bits.

According to item 616, the SSI signal level SSI(i) and the noise flag counting buffer (C(NF) are read by the processor once every 56 bits. Decision 618 determines whether or not the SSI(i) sample just read was at the signalling sensitivity threshold. This determination is made by comparing the number of noise flags C(NF) accumulated over the 56 bit sample period to predetermined threshold levels. If the number of noise flags is greater than NFL, the noise flag lower limit, and is less than NFU, the noise flag upper limit, then the signal strength sample SSI(i) is taken to be "at the sensitivity threshold" and decision 618 selects item 620, to adjust the threshold signal level average, SSI (threshold). If the noise flag count does not safisfy the test conditions, then the received signal level SSI(i) is considered to be either higher than or lower than the sensitivity threshold and decision 618 selects item 622 to compute the average for the raw SSI level. In the present invention, NFL=0 noise flags, and NFU=2 noise flags.

Item 620 shows the SSI(threshold) running average being updated. Here the current signal strength readings, SSI(i) is added to "N" times the contents of the SSI(threshold) register, and the resultant sum is divided by (N+1). If "N" were equal to 1, then the result of this calculation would be a simple average. Values of "N" greater than 1 give greater weighting to the long term average and tend to produce a more constant value for SSI(threshold). In the preferred practice of the present invention, "N"=3.

Item 622 shows the computation of an average signal strength level, SSI(raw), by combining the current SSI(i) sample with the contents of the buffer SSI(raw). This average can be computed in various ways. The preferred method is to accumulate the sum of all SSI(i) samples received during receipt of each particular data message, and at the conclusion of that message, to divide the sum by the number of samples included. The output of this computation is an average level for SSI(raw).

Item 624 shows the calculation of the adjusted value for SSI which is determined by subtracting the contents of the SSI(threshold) register from SSI(raw). The constant $K_m$ is a predetermined adjustment constant to account for any discrepancies between the actual receiver sensitivity threshold and the sensitivity threshold as determined using the noise flag test shown in decision 618. The output of this adjustment is a logarithmically weighted signal strength number which is referenced to the receiver's sensitivity threshold and is independent of any changes in the receiver's gain distribution.

Accordingly, as adaptive signal strength detector has been described. The adaptive signal strength detector utilizes a narrow dynamic range signal sensitivity threshold circuit to indicate when the receiver is operating at the receiver signal strength threshold and uses that information to calibrate the output of the signal strength detector having relatively wide dynamci range. In the preferred practice of the present invention, the output of the signal strength detector is digitized, and the digital output of the receiver sensitivity threshold detector is used by a processing device to determine a factor by which to weight the output of the signal strength detector circuit. For the forgoing, other uses and modifications will be obvious to one skilled in the art without departing from the spirit and scope of the present invention.

What is claimed is:

1. A self-calibrating signal strength detector for use in an RF receiver having an output, comprising:
   (a) an RF signal strength detector coupled to the output of said receiver having a relatively wide dynamic range and an adjustable output signal;
   (b) a receiver sentivity threshold indicator circuit coupled to the output of said receiver circuit having a relatively narrow dynamic range, said receiver sensitivity threshold indicating circuit providing an output signal indicating when a received signal is at the receiver sensitivity threshold; and (c) processing means coupled to each of said signal strength detector and said signal sensitivity threshold indicator circuit for monitoring the outputs thereof and adjusting the output signal of said signal strength detector means to a predetermined value when said signal sensitivity threshold indicator indicates a received signal is at the received threshold.

2. The self-calibrating signal strength detector of claim 1 wherein said receiver sensitivity threshold indicator is a squelch type circuit which may have a two-state output signal.

3. The self-calibrating signal strength detector of claim 1 wherein said receiver sensitivity indicator circuit is a bit noise flag generator.

4. The self-calibrating signal strength detector of claim 1 wherein said processing device is a microcomputer.

5. An adaptive self-calibrating signal strength detector for indicating the signal level of a received RF signal in a receiver comprising:
(a) a receiver having RF, IF, and detector stages capable of receiving a transmitted data signal and producing a data signal at baseband;
(b) a signal strength detector coupled to the IF stage of said receiver having a signal strength detector output signal related to the signal strength of said received data signal;
(c) a receiver sensitivity threshold indicator having a digital output indicating when said received signal is at said receiver's signal sensitivity threshold; and
(d) processing means coupled to said signal strength detector output signal and said signal strength threshold indicator output for determining a correction factor to be applied to said signal strength detector output signal based on the output of said receiver sensitivity threshold indicator.

6. The adaptive signal strength detector of claim 5 wherein sid receiver sensitivity threshold indicator is a squelch type circuit which may have a two-state output signal.

7. The adaptive signal strength detector of claim 5 wherein said receiver sensivity indicator is a bit noise flag generator.

8. The adaptive signal strength detector of claim 5 wherein said processing device is a microcomputer.

9. A method for adaptively correcting the output of a signal strength indicator circuit in a RF receiver, said method comprising the steps of:
(a) receiving an RF signal;
(b) measuring the received RF signal strength with a relatively wide dynamic range signal strength detector having an adjustable output signal;
(c) measuring the received RF signal level with a relatively narrow dynamic range signal sensitivity indicator which provides an output indicating whether said received RF signal is at or near the receiver's sensitivity threshold; and
(d) adjusting the output level of said wide dynamic range signal strength detector to a predetermined value when said narrow dynamic range detector indicates said received signal is at or near the receiver's signal strength threshold.

10. A method of adjusting the output signal of a relatively wide dynamic range signal strength detector in an RF receiver, said method comprising the steps of:
(a) receiving an RF data signal comprising a plurality of individual data bits;
(b) generating a digitized signal which is related to the signal strength of said received RF signal;
(c) generating a noise flag bit for each data bit wherein a noise flag indicates whether a particular data bit is good or bad;
(d) accumulating noise flag bits and data bits over a predetermined period;
(e) adding the number of noise flags accumulated during a particular period to determine the total number of noise flags for that period;
(f) averaging said digitized signal over a predetermined period said averaged digitized signal comprising the unadjusted signal strength level;
(g) determining whether the number of accumulated noise flag bits are within a predetermined range indicating that said received RF signal is at the receiver sensitivity threshold;
(h) determining a signal strength detector output level correction factor if the unadjusted signal strength level does not indicate an average signal strength level within a predefined range.

* * * * *

UNITED STATES PATENT AND TRADEMARK OFFICE
CERTIFICATE OF CORRECTION

PATENT NO. : 4,619,002
DATED : Oct. 21, 1986
INVENTOR(S) : Stuart W. Thro

It is certified that error appears in the above-identified patent and that said Letters Patent is hereby corrected as shown below:

Claim 1, line 7, Column 17, "received" should be --receiver--.

Claim 6, line 41, Column 17, "sid" should be --said--.

Signed and Sealed this

Twenty-seventh Day of January, 1987

Attest:

DONALD J. QUIGG

Attesting Officer      Commissioner of Patents and Trademarks